US006852588B1

(12) United States Patent
Yu et al.

(10) Patent No.: US 6,852,588 B1
(45) Date of Patent: Feb. 8, 2005

(54) METHODS OF FABRICATING SEMICONDUCTOR STRUCTURES COMPRISING EPITAXIAL HF$_3$SI$_2$ LAYERS

(75) Inventors: Zhiyi Yu, Gilbert, AZ (US); Jay A. Curless, Phoenix, AZ (US); Yong Liang, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/883,181

(22) Filed: Jun. 30, 2004

(51) Int. Cl.$^7$ .......................................... H01L 21/8242
(52) U.S. Cl. ...................... 438/240; 438/630; 438/648; 438/649; 438/655; 438/656; 438/676; 438/678; 438/680; 438/681; 438/682; 438/685
(58) Field of Search ................................ 438/240, 630, 438/648–649, 655–656, 676–678, 680–683, 685

(56) References Cited

U.S. PATENT DOCUMENTS

| | | | |
|---|---|---|---|
| 6,039,803 A | | 3/2000 | Fitzgerald et al. |
| 6,797,598 B2 | * | 9/2004 | Lim et al. ................. 438/586 |
| 2004/0040501 A1 | * | 3/2004 | Vartstra ..................... 118/715 |
| 2004/0175882 A1 | * | 9/2004 | Ahn et al. .................. 438/240 |

OTHER PUBLICATIONS

Johnson–Steigelman et al.; "Hafnium Silicide Formation on Si (001)"; Laboratory for Surface Studies and Department of Physics, University of Wisconsin–Milwaukee, Wisconsin; pp 1–25.

Galakhov et al.; "X–ray Emission Spectra and Interfacial Solid–Phase Reactions in Hf/(001)Si System"; 350 Thin Solid Films; pp 143–146 (1999).

So et al.; "Formation and Electrical Properties of HfSi$_2$ Grown Thermally From Evaporated Hf and Si Films"; J.Vac.Sci.Technol. A3 (6); pp 2284–2288; (Nov./Dec. 1985).

Lee et al.; "Multiple Phase Structures of Hf Silicide Precipitated From Hf Silicate: An Atomic View"; J.Vac.Sci. Technol. A20(5); pp 1824–1827; (Sep./Oct. 2002).

Shinkai et al.; "Initial Silicide Formation Process of Single Oriented (002) Hf Film on Si and Its Diffusion Barrier Property"; Japanese Journal of Applied Physics, vol. 37; pp 2002–2006; (1998).

Zaima et al.; "Interfacial Solid–Phase Reactions, Crystallographic Structures, and Electrical Characteristics of Hf/(001) Si Systems"; J. Appl. Phys. 74(11); pp 6703–6709 (Dec. 1993).

* cited by examiner

*Primary Examiner*—Lynne A. Gurley
(74) *Attorney, Agent, or Firm*—Ingrassia, Fisher & Lorenz, P.C.

(57) ABSTRACT

Methods are provided for fabricating semiconductor structures and semiconductor device structures utilizing epitaxial Hf$_3$Si$_2$ layers. A process in accordance with one embodiment of the invention begins by disposing a silicon substrate in a processing chamber. The pressure within the processing chamber and a temperature of the silicon substrate in the range of approximately 250° C. to approximately 700° C. is established. A layer of Hf$_3$Si$_2$ then is grown overlying the silicon substrate at a rate in the range of about one (1) to about five (5) monolayers per minute.

43 Claims, 2 Drawing Sheets

METHODS OF FABRICATING SEMICONDUCTOR STRUCTURES COMPRISING EPITAXIAL HF$_3$SI$_2$ LAYERS

FIELD OF THE INVENTION

The present invention generally relates to semiconductor structures and to methods for their fabrication, and more particularly relates to methods for forming semiconductor structures and semiconductor device structures utilizing epitaxial Hf$_3$Si$_2$ layers.

BACKGROUND OF THE INVENTION

The transition metals, particularly cobalt (Co), nickel (Ni), titanium (Ti), zirconium (Zr) and hafnium (Hf), and their silicides recently have been investigated as candidates for ohmic contact or interconnection materials that can be used in ultralarge scale integrate (ULSI) circuits. These metals and their silicides exhibit desirable properties including low resistivity, thermal and chemical stability, and a high possibility of selective growth. Epitaxial silicides are particularly attractive due to their superior electrical conductivity for contact applications.

Hf$_3$Si$_2$ films have been recognized as one of the more promising constituent materials for metallization systems because of their low Schottky barrier height for silicon and the low contact resistivity of Hf$_3$Si$_2$, which typically is formed by the interfacial solid phase reaction of a hafnium/silicon system. However, growth of Hf$_3$Si$_2$ layers overlying silicon has proven difficult because hafnium can form a variety of other stoichiometric silicide phases in a hafnium/silicon system, including Hf$_2$Si, Hf$_5$S$_4$, HfSi, and HfSi$_2$. The epitaxial growth of Hf$_3$Si$_2$ on silicon also has proven challenging because silicon has a cubic structure, while Hf$_3$Si$_2$ has a tetragonal structure.

Accordingly, it is desirable to provide processes for fabricating semiconductor structures having high quality epitaxial Hf$_3$Si$_2$ layers. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
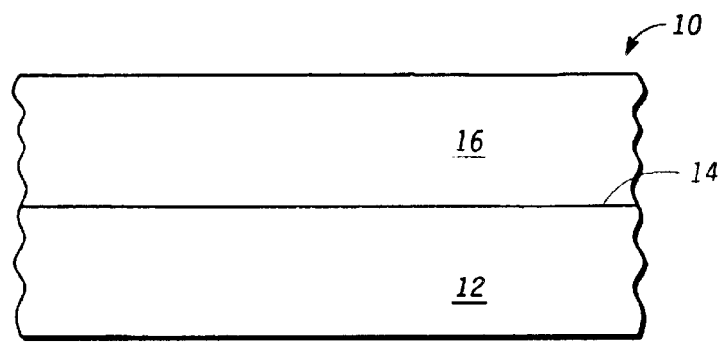
FIG. 1 is a cross-sectional view of a semiconductor structure in accordance with an exemplary embodiment of the present invention.

FIG. 1 illustrates schematically, in cross section, a portion of a semiconductor structure 10 in accordance with an exemplary embodiment of the present invention. Semiconductor structure 10 comprises a silicon substrate 12 having any suitable lattice configuration, such as for example, Si (001) and Si (111). As described in more detail below, silicon substrate 12 may comprise a surface 14 of clean silicon or may comprise a passivated surface 14 that has been passivated with a suitable metal, such as, for example, strontium (Sr) or barium (Ba). In another embodiment of the invention, silicon substrate 12 may comprise a (001) silicon substrate that has been off-cut, such as, for example, towards a (110) direction. The growth of materials on a miscut Si (001) substrate is known in the art. For example, U.S. Pat. No. 6,039,803, issued to Fitzgerald et al. on Mar. 21, 2000, which patent is herein incorporated by reference in its entirety, is directed to growth of silicon-germanium and germanium layers on miscut Si (001) substrates. A miscut silicon substrate may result in improved quality of a subsequently grown epitaxial material layer. Substrate 12 may be off-cut in the range of from about 1 degree to about 6 degrees towards the (110) direction.

Figure 2:
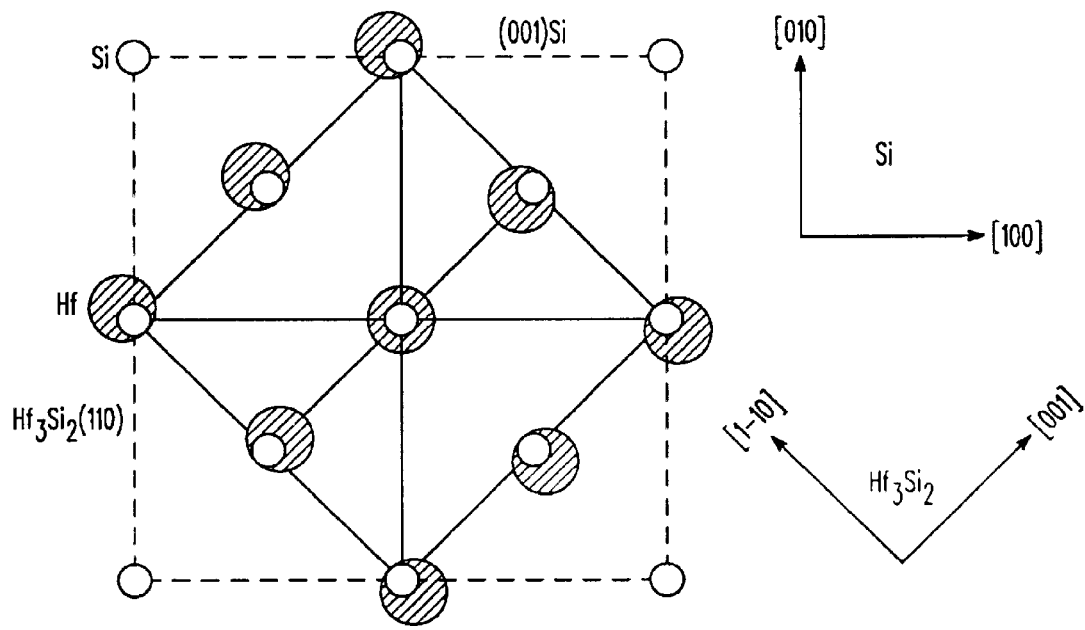
FIG. 2 is an illustration of an overlapped atomic arrangement of the interface for the epitaxial relationship of hafnium and silicon.

Semiconductor structure 10 also comprises an epitaxial layer 16 of Hf$_3$Si$_2$. Hf$_3$Si$_2$ has a tetragonal structure with lattice constants of a=b=7.00 angstroms and c=3.671 angstroms. Silicon has a cubic diamond structure with lattice constants of a=b=c=5.431 angstroms. Accordingly, without intending to be bound by theory, it is believed that the epitaxial relationship between Hf$_3$Si$_2$ and silicon is Hf$_3$Si$_2$ (110)//Si(001) and Hf$_3$Si$_2$[001]//Si[110]. FIG. 2 illustrates an overlapped atomic arrangement of the interface for the epitaxial relationship of hafnium silicide and silicon in which the lattice mismatch may be about 4.4% along [001] Hf$_3$Si$_2$ and about 8.9% along [110] Hf$_3$Si$_2$.

Figure 3:
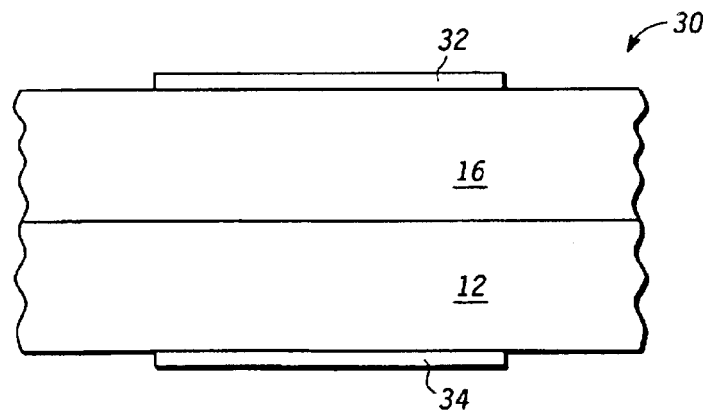
FIG. 3 is a cross-sectional view of a semiconductor device structure in accordance with an exemplary embodiment of the present invention.

The semiconductor structure 10 of FIG. 1 may be utilized to form any suitable semiconductor device structure, such as a semiconductor device structure 30 as illustrated in FIG. 3, which may be used to form a semiconductor device. Device structure 30 includes silicon substrate 12 and epitaxial Hf$_3$Si$_2$ layer 16. Device structure 30 may further include a first material layer or layers 32 overlying epitaxial Hf$_3$Si$_2$ layer 16. First material layer(s) 32 may comprise a layer of metal, a layer of dielectric material, or a combination thereof, or a layer or layers of any other material(s) suitable for use in a semiconductor device. Device structure 30 also may comprise a second material layer or layers 34 disposed proximate to silicon substrate 12, such as, for example, a metal layer(s) or a dielectric material layer(s), and the like. As will be appreciated, semiconductor device structure 30 may have any suitable configuration and may comprise any material layers 32 and 34, and any additional material layers, that may be suitable for a particular device application.

Figure 4:
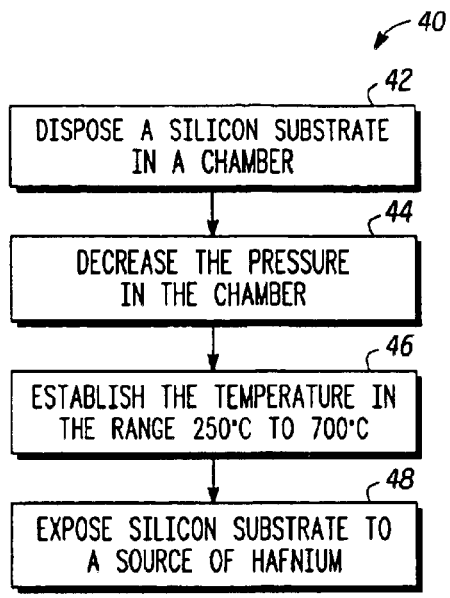
FIG. 4 is a flowchart of a process for forming the semiconductor structure of FIG. 1 in accordance with an embodiment of the present invention.

Referring to FIG. 4, the following example illustrates a process, in accordance with one embodiment of the present invention, for fabricating a semiconductor structure such as the structure illustrated in FIG. 1. The process 40 begins by disposing a silicon substrate in a chamber of a suitable processing apparatus (step 42). The silicon substrate may be of a p-type or an n-type and may have any suitable lattice configuration, such as, for example, (001) or (111), and any suitable surface reconfiguration, such as, for example, (2×1), (7×7), and the like.

In one embodiment of the invention, at least a portion of the surface 14 of silicon substrate 12 has a bare surface, although other portions of the substrate may encompass other structures. The term "bare" in this context means that the surface in the portion of the silicon substrate has been cleaned to remove any oxides, contaminants, or other foreign material. As is well known, bare silicon is highly reactive and readily forms a native oxide. A thin silicon oxide may also be intentionally grown on the semiconductor substrate, although such a grown oxide is not essential to the process in accordance with the invention. In order to epitaxially grow an $Hf_3Si_2$ layer overlying the silicon substrate, the native oxide layer must first be removed or reduced to expose the crystalline structure of the underlying substrate. The portion of the surface of the silicon substrate may be cleaned using any conventional method, such as thermal desorption or H-termination by acid cleaning. In another example, the native oxide can be removed by first thermally depositing a thin layer of silicon, germanium, a combination of silicon and germanium in a molecular beam epitaxy (MBE) apparatus or other suitable deposition apparatus at a substrate temperature below the $SiO_2$ desorption temperature (~850° C.). The silicon serves to reduce the native oxide and the resultant surface exhibits an ordered (2×1) structure. In yet another example, the native oxide can be removed by first thermally depositing a thin layer (preferably 1–3 monolayers) of strontium, barium, a combination of strontium and barium, or other alkaline earth metals or combinations of alkaline earth metals in an MBE apparatus or other suitable deposition apparatus. In a case where strontium is used, the substrate is then heated to a temperature above 720° C. to cause the strontium to react with the native silicon oxide layer. The strontium serves to reduce the silicon oxide to leave a silicon oxide-free surface. The resultant surface may exhibit an ordered (2×1) structure.

After cleaning the silicon substrate, an $Hf_3Si_2$ layer may be grown overlying the silicon substrate to form a semiconductor structure in accordance with one embodiment of the present invention. Growth of the epitaxial $Hf_3Si_2$ layer is preferably carried out by molecular beam epitaxy (MBE). However, the process can also be carried out by chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. For convenience, the process will be described with reference to deposition of the epitaxial $Hf_3Si_2$ layer in an MBE apparatus, although it will be appreciated that the process could be suitably performed using any of the above-listed methods. Accordingly, the silicon substrate may be disposed in a chamber of an MBE apparatus.

After disposition of the silicon substrate in the deposition chamber, an ultra high vacuum environment then may be created and maintained in the chamber (step 44). Preferably, the pressure in the chamber is evacuated to a pressure in the range of about $10^{-10}$ to about $10^{-7}$ Torr, although any pressure suitable for deposition of the epitaxial $Hf_3Si_2$ layer may be established in the chamber.

The MBE process is initiated by heating the silicon substrate to a temperature in the range of about 250° C. to about 700° C. (step 46), preferably, in the range of about 450° C. to about 650° C. and, more preferably, in the range of about 550° C. to about 650° C. A shutter in the MBE apparatus may be opened to expose the silicon substrate to a first source of hafnium that is evaporated by an electron beam (step 48), creating a hafnium flux that causes epitaxial $Hf_3Si_2$ to deposit on the silicon surface at a rate of about one (1) to about five (5) monolayers per minute. In a preferred embodiment of the invention, epitaxial $Hf_3Si_2$ is deposited on the silicon surface at a rate of about one (1) to about two (2) monolayers per minute. The silicon substrate is exposed to the hafnium flux for a period of time sufficient for at least one (1) to ten (10) monolayers of epitaxial $Hf_3Si_2$ to form on the silicon substrate. In one embodiment of the invention, the silicon substrate is exposed to the hafnium flux for at least two (2) minutes. In a preferred embodiment of the invention, the silicon substrate is exposed to the hafnium flux for a period of time in the range of about five (5) minutes to about one (1) hour. The deposition process may be observed using RHEED monitoring techniques to monitor the epitaxial growth of the $Hf_3Si_2$ layer. It will be appreciated that, in an optional embodiment of the invention, the surface of the silicon substrate may be exposed to a surfactant, such as, antimony, arsenic, hydrogen, bismuth, and the like, either before or during deposition of the epitaxial $Hf_3Si_2$ to facilitate deposition of the epitaxial $Hf_3Si_2$.

Without intending to be bound by any particular theory, it is believed that by using the temperatures of the above-described process, silicon atoms within the silicon substrate are caused to be the dominant diffusing species. Accordingly, silicon atoms diffuse from within the silicon substrate to the silicon substrate surface where they interact with the hafnium atoms evaporated from the hafnium source to form stoichiometric $Hf_3Si_2$. By using the above-described deposition parameters to affect the above-prescribed deposition rates, a high-quality epitaxial layer of stoichiometric $Hf_3Si_2$ may be formed overlying the silicon substrate.

In one embodiment of the invention, the first source of hafnium may be a source of metal hafnium. In another exemplary embodiment of the invention, the first source of hafnium may be a source of $Hf_3Si_2$. In this regard, hafnium and silicon fluxes are provided in the deposition chamber at the preferred stoichiometric ratio. Alternatively, the silicon substrate may be exposed to both a hafnium source and a silicon source that are evaporated by electron beam to create a flux having a hafnium:silicon ratio of 3:2. In the latter two embodiments, as silicon is provided at the silicon substrate surface from a source other than the silicon substrate itself, it may not be necessary to heat the silicon substrate to a temperature that causes silicon atoms to diffuse from the silicon substrate. Accordingly, the deposition process may be performed at a temperature lower than that required if the only source of silicon is the substrate. Deposition of the $Hf_3Si_2$ layer at temperatures at the lower end of the above-described temperature ranges may improve the epitaxial quality of the resulting $Hf_3Si_2$ layer.

Following fabrication of the $Hf_3Si_2$ layer, the semiconductor structure may be subjected to further processing. For example, the semiconductor structure may be subjected to an anneal process, as is typical in complementary metal oxide semiconductor (CMOS) processing. Alternatively, or in addition, the semiconductor structure may be subjected to other subsequent processing techniques, such as metal deposition, to form a semiconductor device structure.

Figure 5:
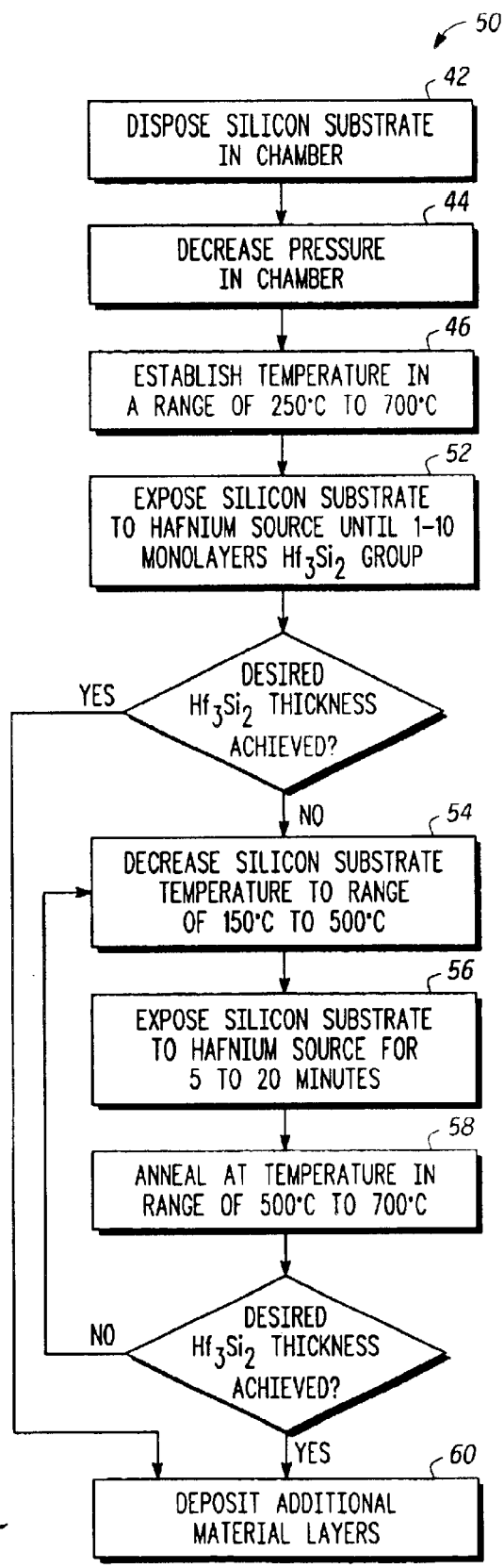
FIG. 5 is a flowchart of a process for forming the semiconductor structure of FIG. 1 in accordance with another embodiment of the present invention.

A process 50 in accordance with another exemplary embodiment of the invention is shown in FIG. 5. Process 50 may be utilized to grow epitaxial $Hf_3Si_2$ layers having any suitable desired thickness while maintaining the high quality epitaxial properties of the $Hf_3Si_2$ layer. Process 50 is similar to process 40 as process 50 utilizes the same steps 42–46 of process 40, as illustrated in FIG. 4. Accordingly, referring to FIG. 5, process 50 comprises the above-described steps of disposing a silicon substrate, at least a portion of which has a clean substrate surface, in a processing chamber (step 42), and decreasing the pressure in the chamber (step 44). Next, the MBE process is initiated by heating the silicon substrate to a first deposition temperature in the range of about 250° C. to about 700° C. (step 46), preferably, in the range of about 450° C. to about 650° C. and, more preferably, in the range of about 550° C. to about 650° C. A shutter in the MBE apparatus may be opened to expose the silicon substrate to a first source of hafnium that is evaporated by an electron beam (step 52), creating a hafnium flux. As described above with reference to process 40, in one embodiment of the invention, the first source of hafnium may be metal hafnium. In another embodiment of the invention, the silicon substrate may be exposed to a source of $Hf_3Si_2$ or, alternatively, may be exposed to a source of hafnium and a source of silicon that are evaporated by electron beam in a manner such that fluxes having a hafnium:silicon ratio of 3:2 are created. The hafnium flux (or the hafnium and silicon fluxes) causes epitaxial $Hf_3Si_2$ to deposit on the silicon surface at a rate of about one (1) to about five (5) monolayers per minute. In a preferred embodiment of the invention, epitaxial $Hf_3Si_2$ is deposited on the silicon surface at a rate of about one (1) to about two (2) monolayers per minute. The silicon substrate is exposed to the hafnium flux for a period of time sufficient for one (1) to ten (10) monolayers of epitaxial $Hf_3Si_2$ to form on the silicon substrate.

If an epitaxial $Hf_3Si_2$ layer having a thickness greater than about 10 monolayers is desired, process 50 may continue by decreasing the temperature of the silicon substrate to a second deposition temperature that is below the first deposition temperature (step 54). In one embodiment of the present invention, the temperature of the silicon substrate may be decreased to a temperature in the range of about 10° C. (approximately room temperature) to about 500° C., preferably in the range of about 150° C. to about 300° C. The silicon substrate then is exposed to a second source of hafnium for a period of about five (5) to about twenty (20) minutes, thereby causing the epitaxial growth of additional hafnium silicide ($Hf_xSi_y$) on the first deposited $Hf_3Si_2$ layer (step 56). The second source of hafnium may be the same as the first source of hafnium or may comprise any of the other sources of hafnium as described above. After the hafnium silicide layer has achieved a desired thickness, or after the deposition has continued for a desired amount of time, exposure of the silicon substrate to the second hafnium source is terminated and the as-deposited hafnium silicide layer and silicon substrate may be subjected to a thermal anneal to complete $Hf_3Si_2$ layer formation, using conventional annealing methods, at a temperature in the range of about 500° C. to about 700° C. (step 58).

If the desired epitaxial $Hf_3Si_2$ layer thickness has not yet been achieved, steps 54, 56 and 58 may be repeated until the epitaxial $Hf_3Si_2$ layer has achieved the desired thickness. In this regard, after the first annealing, the temperature of the silicon substrate may again be lowered to a temperature below the anneal temperature, preferably 10° C. (approximately room temperature) to about 500° C., more preferably in the range of about 150° C. to about 300° C. (step 54). Additional $Hf_3Si_2$ then may be deposited overlying the silicon substrate as described above (step 56) and the silicon substrate then may be subjected to a thermal anneal (step 58). Steps 54, 56, and 58 again may be repeated one or more times until the $Hf_3Si_2$ layer has achieved the desired thickness. Each of the deposition processes described above may be observed using RHEED monitoring techniques to monitor the epitaxial growth of the $Hf_3Si_2$ layer.

Following fabrication of the $Hf_3Si_2$ layer, the semiconductor structure may be subjected to further processing and material deposition to fabricate a semiconductor device (step 60). For example, a metal layer or layers may be formed on the epitaxial $Hf_3Si_2$ layer and/or on the silicon substrate to form a semiconductor device structure. Alternatively, or in addition, a layer or layers of dielectric material or other material layer(s) may be deposited on the $Hf_3Si_2$ layer and/or the silicon substrate as required for any suitable device application.

Accordingly, processes for the fabrication of semiconductor structures comprising epitaxial $Hf_3Si_2$ layers have been described. The processes provide for high quality epitaxial $Hf_3Si_2$ layers that may be grown on silicon substrates to any suitable desired thickness. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A process for fabricating a semiconductor structure, the process comprising the steps of:

disposing a silicon substrate in a processing chamber;

decreasing the pressure within the processing chamber;

establishing a temperature of the silicon substrate in the range of approximately 250° C. to approximately 700° C.; and epitaxially growing a layer of $Hf_3Si_2$ overlying the silicon substrate at a rate in the range of about one (1) to about five (5) monolayers per minute.

2. The process for fabricating a semiconductor structure of claim 1, wherein the step of disposing a silicon substrate in a processing chamber comprises the step of disposing in a processing chamber a (001) silicon substrate that has been off-cut towards a (110) direction.

3. The process for fabricating a semiconductor structure of claim 1, further comprising the step of forming a silicon oxide layer on the silicon substrate before the step of establishing a temperature of the silicon substrate.

4. The process for fabricating a semiconductor structure of claim 1, further comprising the step of deoxidizing the silicon substrate with an alkaline earth metal before the step of establishing a temperature of the silicon substrate.

5. The process for fabricating a semiconductor structure of claim 1, wherein the step of epitaxially growing a layer of $Hf_3Si_2$ overlying the silicon substrate is performed by one selected from the group consisting of MBE, CVD, MOCVD, MEE, ALE, PVD, CSD, and PLD.

6. The process for fabricating a semiconductor structure of claim 1, wherein the step of decreasing the pressure in the processing chamber comprise the step of decreasing the pressure to within a range of about $10^{-10}$ to about $10^{-7}$ Torr.

7. The process for fabricating a semiconductor structure of claim 1, wherein the step of establishing a temperature of the silicon substrate comprises the step of establishing a temperature of the silicon substrate in a range of about 450° C. to about 650° C.

8. The process for fabricating a semiconductor structure of claim 7, wherein the step of establishing a temperature of the silicon substrate comprises the step of establishing a temperature of the silicon substrate in a range of about 550° C. to about 650° C.

9. The process for fabricating a semiconductor structure of claim 1, wherein the step of epitaxially growing a layer of $Hf_3Si_2$ overlying the silicon substrate at a rate in the range of about one (1) to about five (5) monolayers per minute comprises the step of epitaxially growing a layer of $Hf_3Si_2$ overlying the silicon substrate at a rate in the range of about one (1) to about two (2) monolayers per minute.

10. The process for fabricating a semiconductor structure of claim 1, wherein the step of epitaxially growing a layer of $Hf_3Si_2$ overlying the silicon substrate at a rate in the range of about one (1) to about five (5) monolayers comprises the step of epitaxially growing a layer of $Hf_3Si_2$ overlying the silicon substrate for a time period in a range of about five (5) minutes to about one (1) hour.

11. The process for fabricating a semiconductor structure of claim 1, wherein the step of epitaxially growing a layer of $Hf_3Si_2$ overlying the silicon substrate comprises the step of exposing the silicon substrate to a source of metal hafnium.

12. The process for fabricating a semiconductor structure of claim 1, wherein the step of epitaxially growing a layer of $Hf_3Si_2$ overlying the silicon substrate comprises the step of exposing the silicon substrate to a source of $Hf_3Si_2$.

13. The process for fabricating a semiconductor structure of claim 1, wherein the step of epitaxially growing a layer of $Hf_3Si_2$ overlying the silicon substrate comprises the step of exposing the silicon substrate to a source of metal hafnium and a source of silicon that create a flux in the chamber having a hafnium:silicon ratio of about 3:2.

14. The process for fabricating a semiconductor structure of claim 1, the process further comprising the step of exposing the silicon substrate to a surfactant after the step of disposing the silicon substrate in the processing chamber.

15. A process for fabricating a semiconductor structure, the process comprising the steps of:
    providing a silicon substrate;
    creating and maintaining the silicon substrate in an ultra high vacuum environment;
    establishing a temperature of the silicon substrate in the range of approximately 250° C. to approximately 700° C.; and
    exposing the silicon substrate to a first source of hafnium for a time period sufficient to grow an epitaxial $Hf_3Si_2$ layer having a thickness in the range of from about one to about ten (10) mono layers.

16. The process for fabricating a semiconductor structure of claim 15, wherein the step of providing a silicon substrate comprises the step of providing a (001) silicon substrate that has been off-cut towards a (110) direction.

17. The process for fabricating a semiconductor structure of claim 15, further comprising the step of forming a silicon oxide layer on the silicon substrate before the step of establishing a temperature of the silicon substrate.

18. The process for fabricating a semiconductor structure of claim 15, wherein the step of exposing the silicon substrate to a first source of hafnium is performed by one of MBE, CVD, MOCVD, MEE, ALE, PVD, CSD, and PLD.

19. The process for fabricating a semiconductor structure of claim 15, wherein the step of creating and maintaining the silicon substrate in an ultra high vacuum environment comprises the step of creating and maintaining the silicon substrate in an environment having a pressure in a range of about $10^{-10}$ to about $10^{-7}$ Torr.

20. The process for fabricating a semiconductor structure of claim 15, wherein the step of establishing a temperature of the silicon substrate comprises the step of establishing a temperature of the silicon substrate in a range of about 450° C. to about 650° C.

21. The process for fabricating a semiconductor structure of claim 15, wherein the step of establishing a temperature of the silicon substrate comprises the step of establishing a temperature of the silicon substrate in a range of about 550° C. to about 650° C.

22. The process for fabricating a semiconductor structure of claim 15, wherein the step of exposing the silicon substrate to a first source of hafnium comprises the step of epitaxially growing $Hf_3Si_2$ overlying the silicon substrate at a rate in the range of about one (1) to about five (5) monolayers per minute.

23. The process for fabricating a semiconductor structure of claim 22, wherein the step of exposing the silicon substrate to a first source of hafnium comprises the step of epitaxially growing $Hf_3Si_2$ overlying the silicon substrate at a rate in the range of about one (1) to about two (2) monolayers per minute.

24. The process for fabricating a semiconductor structure of claim 15, wherein the step of exposing the silicon substrate to a first source of hafnium comprises the step of exposing the silicon substrate to a source of metal hafnium.

25. The process for fabricating a semiconductor structure of claim 15, wherein the step of exposing the silicon substrate to a first source of hafnium comprises the step of exposing the silicon substrate to a source of $Hf_3Si_2$.

26. The process for fabricating a semiconductor structure of claim 15, wherein the step of exposing the silicon substrate to a first source of hafnium comprises the step of exposing the silicon substrate to a source of metal hafnium and a source of silicon that create a flux having a hafnium:silicon ratio of about 3:2.

27. The process for fabricating a semiconductor structure of claim 15, the process further comprising the step of exposing the silicon substrate to a surfactant after the step of providing a silicon substrate.

28. The process for fabricating a semiconductor structure of claim 15, further comprising the steps of:
    lowering the temperature of the silicon substrate to a temperature in a range of approximately 10° C. to approximately 500° C.;
    exposing the silicon substrate to a second source of hafnium for a time period in a range of about five (5) to about twenty (20) minutes; and
    subjecting the silicon substrate to an anneal at a temperature in a range of approximately 500° C. to approximately 700° C.

29. The process for fabricating a semiconductor structure of claim 28, wherein the steps of lowering the temperature of the silicon substrate, exposing the silicon substrate to a second source of hafnium, and subjecting the silicon substrate to an anneal are performed repeatedly until an epitaxial $Hf_3Si_2$ layer having a desired thickness is achieved.

30. The process for fabricating a semiconductor structure of claim 28, wherein the step of lowering the temperature of the silicon substrate comprises the step of lowering the temperature of the silicon substrate to a temperature in a range of about 150° C. to about 300° C.

31. The process for fabricating a semiconductor structure of claim 28, wherein the step of exposing the silicon substrate to a second source of hafnium comprises the step of exposing the silicon substrate to the first source of hafnium.

32. A process for fabricating a semiconductor structure, the process comprising the steps of:

disposing a silicon substrate in a processing chamber;

creating and maintaining an ultra high vacuum environment in the processing chamber;

establishing a temperature of the silicon substrate in the range of approximately 250° C. to approximately 700° C.;

exposing the silicon substrate to a first source of hafnium to grow a layer of epitaxial $Hf_3Si_2$ having a thickness of about one (1) to ten (10) monolayers;

lowering the temperature of the silicon substrate to a temperature in a range of approximately 10° C. to approximately 500° C.;

exposing the silicon substrate to a second source of hafnium for a time period in a range of about five (5) to about twenty (20) minutes to increase the thickness of the layer of epitaxial $Hf_3Si_2$; and subjecting the silicon substrate to an anneal at a temperature in a range of approximately 500° C. to approximately 700° C.

33. The process for fabricating a semiconductor structure of claim 32, wherein the step of creating and maintaining an ultra high vacuum environment comprises the step of creating and maintaining an environment having a pressure in a range of about $10^{-10}$ to about $10^{-7}$ Torr.

34. The process for fabricating a semiconductor structure of claim 32, the process further comprising the step of exposing the silicon substrate to a surfactant after the step of disposing the silicon substrate in a processing chamber.

35. The process for fabricating a semiconductor device structure of claim 32, wherein the step of exposing the silicon substrate to a first source of hafnium comprises the step of epitaxially growing $Hf_3Si_2$ overlying the silicon substrate at a rate in the range of about one (1) to about five (5) monolayers per minute.

36. The process for fabricating a semiconductor device structure of claim 35, wherein the step of exposing the silicon substrate to a first source of hafnium comprises the step of epitaxially growing $Hf_3Si_2$ overlying the silicon substrate at a rate in the range of about one (1) to about two (2) monolayers per minute.

37. The process for fabricating a semiconductor device structure of claim 32, wherein the step of exposing the silicon substrate to a first source of hafnium comprises the step of exposing the silicon substrate to a source of metal hafnium.

38. The process for fabricating a semiconductor device structure of claim 32, wherein the step of exposing the silicon substrate to a first source of hafnium comprises the step of exposing the silicon substrate to a source of $Hf_3Si_2$.

39. The process for fabricating a semiconductor device structure of claim 32, wherein the step of exposing the silicon substrate to a first source of hafnium comprises the step of exposing the silicon substrate to a source of metal hafnium and a source of silicon that create a flux in the chamber having a hafnium:silicon ratio of about 3:2.

40. The process for fabricating a semiconductor device structure of claim 32, wherein each of the steps of exposing the silicon substrate to a first source of hafnium and exposing the silicon substrate to a second source of hafnium is performed by one of MBE, CVD, MOCVD, MEE, ALE, PVD, CSD, and PLD.

41. The process for fabricating a semiconductor device structure of claim 32, wherein the steps of lowering the temperature of the silicon substrate, exposing the silicon substrate to a second source of hafnium, and subjecting the silicon substrate to an anneal are performed repeatedly until an epitaxial $Hf_3Si_2$ layer having a desired thickness is achieved.

42. The process for fabricating a semiconductor device structure of claim 32, wherein the step of lowering the temperature of the silicon substrate comprises the step of lowering the temperature of the silicon substrate to a temperature in a range of about 150° C. to about 300° C.

43. The process for fabricating a semiconductor device structure of claim 32, wherein the step of exposing the silicon substrate to a second source of hafnium comprises the step of exposing the silicon substrate to the first source of hafnium.

* * * * *